(12) United States Patent
Feldbaum et al.

(10) Patent No.: US 9,605,348 B2
(45) Date of Patent: Mar. 28, 2017

(54) APPARATUSES AND METHODS UTILIZING ETCH STOP LAYERS

(71) Applicant: Seagate Technology LLC, Cupertino, CA (US)

(72) Inventors: Michael R. Feldbaum, San Jose, CA (US); Koichi Wago, Sunnyvale, CA (US); Gennady Gauzner, San Jose, CA (US); Kim Y. Lee, Fremont, CA (US); David S. Kuo, Palo Alto, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/161,097

(22) Filed: May 20, 2016

(65) Prior Publication Data

US 2016/0266493 A1    Sep. 15, 2016

Related U.S. Application Data

(63) Continuation of application No. 14/221,165, filed on Mar. 20, 2014, now Pat. No. 9,370,907.

(51) Int. Cl.
| | |
|---|---|
| *H01L 21/00* | (2006.01) |
| *C23F 1/00* | (2006.01) |
| *B29C 33/38* | (2006.01) |
| *G03F 7/00* | (2006.01) |
| *B29D 17/00* | (2006.01) |
| *G11B 5/855* | (2006.01) |
| *G03F 7/20* | (2006.01) |
| *G03F 7/09* | (2006.01) |
| *B29K 101/00* | (2006.01) |

(52) U.S. Cl.
CPC ............ *C23F 1/00* (2013.01); *B29C 33/3842* (2013.01); *B29D 17/00* (2013.01); *G03F 7/0017* (2013.01); *G03F 7/09* (2013.01); *G03F 7/2002* (2013.01); *G11B 5/855* (2013.01); *B29K 2101/00* (2013.01); *B29K 2909/00* (2013.01); *Y10T 428/24802* (2015.01); *Y10T 428/24851* (2015.01); *Y10T 428/24917* (2015.01)

(58) Field of Classification Search
CPC .................... H01L 21/8221; H01L 27/0688
USPC ......................................... 257/350; 438/152
See application file for complete search history.

(56) References Cited

U.S. PATENT DOCUMENTS

| | | | |
|---|---|---|---|
| 7,375,040 B2 | 5/2008 | Lin et al. | |
| 7,588,667 B2 * | 9/2009 | Cerio, Jr. ............... | C23C 14/046 204/192.12 |
| 7,846,565 B2 | 12/2010 | Fullerton et al. | |
| 8,147,995 B2 | 4/2012 | Xi et al. | |
| 8,486,288 B2 | 7/2013 | Ohashi | |
| 8,592,940 B2 | 11/2013 | Sandhu et al. | |
| 2002/0192976 A1 | 12/2002 | Trapp et al. | |
| 2004/0063305 A1 * | 4/2004 | Kloster ............... | H01L 21/7682 438/619 |

(Continued)

*Primary Examiner* — Jami M Valentine (57) ABSTRACT

Provided herein is an apparatus, including a substrate; an etch stop layer overlying the substrate, wherein the etch stop layer is substantially resistant to etching conditions; and a patterned layer overlying the etch stop layer, wherein the patterned layer is substantially labile to the etching conditions, and wherein the patterned layer comprises a number of features including substantially consistent feature profiles among regions of high feature density and regions of low feature density.

23 Claims, 7 Drawing Sheets

(56) References Cited

U.S. PATENT DOCUMENTS

| | | | |
|---|---|---|---|
| 2008/0146037 A1* | 6/2008 | Fuller | H01L 21/76807 438/717 |
| 2009/0093100 A1 | 4/2009 | Xia et al. | |
| 2009/0140458 A1 | 6/2009 | Xu et al. | |
| 2011/0104891 A1* | 5/2011 | Al-Bayati | H01L 21/3105 438/643 |
| 2013/0122712 A1* | 5/2013 | Kim | H01L 21/31116 438/714 |
| 2014/0264896 A1* | 9/2014 | Lu | H01L 23/5329 257/773 |

* cited by examiner

APPARATUSES AND METHODS UTILIZING ETCH STOP LAYERS

RELATED APPLICATIONS

The instant application is a continuation application and claims the benefit and priority to the pending U.S. patent application Ser. No. 14/221,165 filed on Mar. 20, 2014, entitled "Apparatuses and Methods Utilizing Etch Stop Layers" which is incorporated herein in its entirety by reference.

BACKGROUND

Fabricating a patterned apparatus such as a patterned recording medium requires creation of a high-quality template for creating a high-quality mask for patterning the nascent patterned apparatus.

SUMMARY

Provided herein is an apparatus, including a substrate; an etch stop layer overlying the substrate, wherein the etch stop layer is substantially resistant to etching conditions; and a patterned layer overlying the etch stop layer, wherein the patterned layer is substantially labile to the etching conditions, and wherein the patterned layer comprises a number of features including substantially consistent feature profiles among regions of high feature density and regions of low feature density.

These and other features and/or aspects of the concepts provided herein may be better understood with reference to the following drawings, description, and appended claims.

DESCRIPTION

Before some particular embodiments are illustrated and/or described in greater detail, it should be understood by persons having ordinary skill in the art that the particular embodiments provided herein do not limit the scope of the concepts provided herein, as features of such particular embodiments may vary. It should likewise be understood that a particular embodiment provided herein has one or more features that may be readily separated from the particular embodiment and optionally combined with or substituted for one or more features of any of a number of other embodiments illustrated and/or described herein.

It should also be understood by persons having ordinary skill in the art that the terminology used herein is for the purpose of describing the particular embodiments, and the terminology does not limit the scope of the concepts provided herein. Unless indicated otherwise, ordinal numbers (e.g., first, second, third, etc.) are used to distinguish or identify different features or steps in a group of features or steps, and do not supply a serial or numerical limitation. For example, "first," "second," and "third" features or steps need not necessarily appear in that order, and the particular embodiments need not necessarily be limited to the three features or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," or the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art.

Fabricating a patterned apparatus such as a patterned recording medium (e.g., a bit-patterned medium ("BPM")) requires creation of a high-quality template for creating a high-quality mask for patterning the nascent patterned apparatus. The quality of the template is limited by etch-based variation in feature positions and/or feature profiles, which result from design-imposed variation in feature density and/or aspect ratio. In addition, gas is often trapped between the template and a resist while imprinting the resist for creating the mask for patterning the nascent patterned apparatus. The trapped gas prevents the resist from completely filling each and every space between the features of the template leading to topographical imperfections in the resulting imprinted resist. Further in addition, separation of the template from the imprinted resist after imprinting often requires an excessive separation force to overcome a partial vacuum created between the template and the imprinted resist during the separation. The excessive separation force leads to dislocation, collapse, and/or other damage to the features of the imprinted resist.

Figure 1:
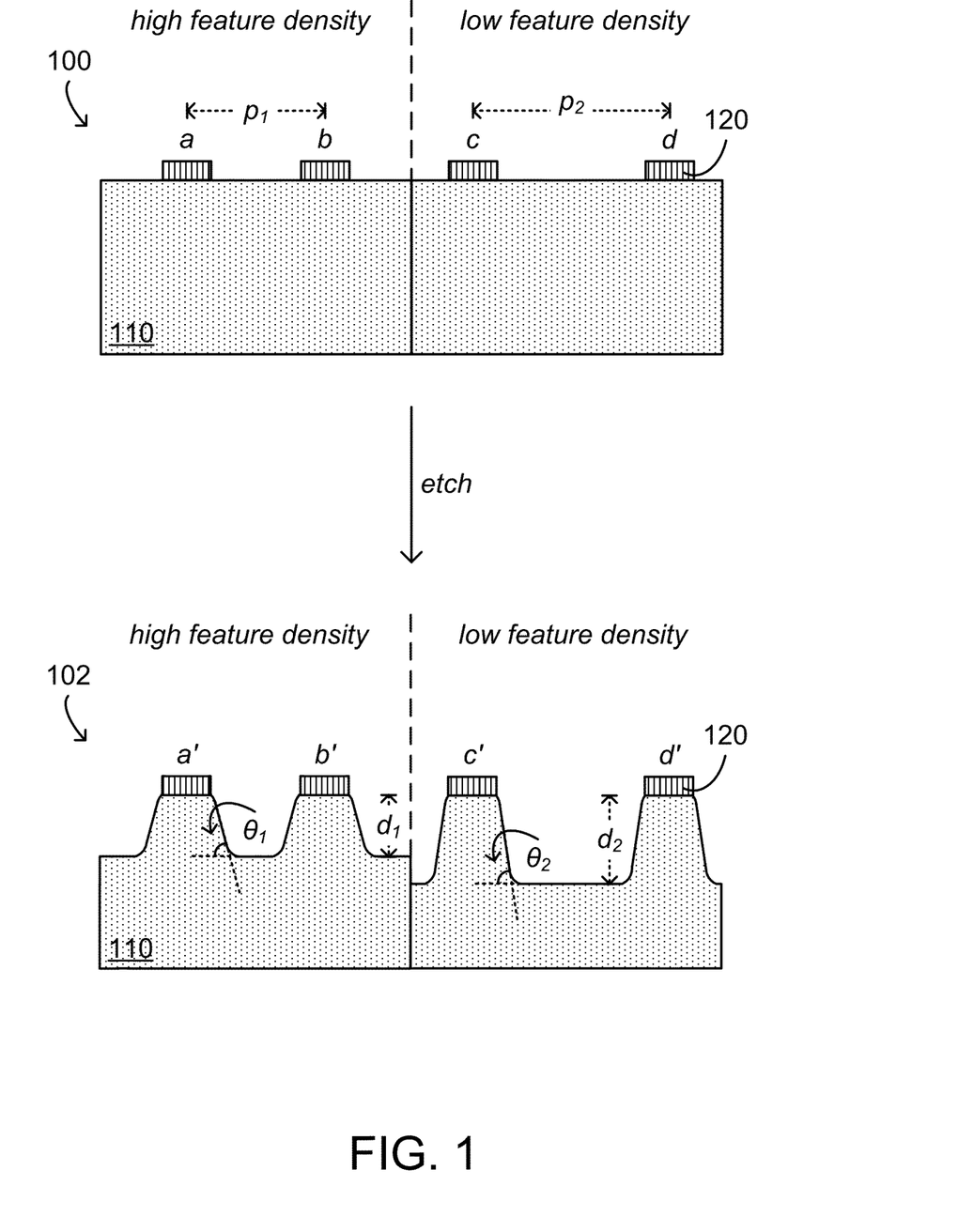
FIG. 1 provides a schematic illustrating some difficulties in etching an apparatus having a design-imposed variation in feature density.

FIG. 1 provides a schematic illustrating some difficulties in etching an apparatus having a design-imposed variation in feature density.

As illustrated in FIG. 1, a cross-section of such an apparatus 100 includes a region of relatively high feature density and a region of relatively low feature density as an example of the design-imposed variation in feature density. The apparatus 100 further includes a substrate 110 and a patterned mask 120 overlying the substrate 110, which patterned mask includes features a and b in the region of high feature density and features c and d in the region of low feature density. The features a and b have a center-to-center pitch $p_1$ therebetween, and the features c and d have a center-to-center pitch $p_2$ therebetween, wherein $p_1 < p_2$ in accordance with the features a and b being in the region of high feature density and the features c and d being in the region of low feature density. In view of $p_1 < p_2$, the features a and b have a relatively high aspect ratio and the features c and d have a relatively low aspect ratio for features a-d of equal height.

As further illustrated in FIG. 1, a cross-section of an apparatus 102 includes features a' and b' in the region of high feature density and features c' and d' in the region of low feature density subsequent to etching the substrate 110 of the apparatus 100. With respect to a feature profile element such as feature depth, another one of the difficulties in etching an apparatus having a design-imposed variation in feature density includes etching consistent feature depths among regions of high feature density and regions of low feature density. This is illustrated by the features a' and b' having a feature depth $d_1$, and the features c' and d' having a feature depth $d_2$, wherein $d_1 < d_2$ in accordance with the features a' and b' being in the region of high feature density and the features c' and d' being in the region of low feature density and/or in accordance with the features a' and b' having a high aspect ratio and the features c' and d' having a low aspect ratio. With respect to a feature profile element such as feature sidewall angle, one of the difficulties in etching an apparatus having a design-imposed variation in feature density includes etching consistent feature sidewall angles among regions of high feature density and regions of low feature density. This is illustrated by the features a' and b' having a feature sidewall angle $\theta_1$, and the features c' and d' having a feature sidewall angle $\theta_2$, wherein $\theta_1 < \theta_2$ in accordance with the features a' and b' being in the region of high feature density and the features c' and d' being in the region of low feature density and/or in accordance with the features a' and b' having a high aspect ratio and the features c' and d' having a low aspect ratio. Consistency in feature position and other feature profile elements such as feature size present yet other difficulties in etching an apparatus having a design-imposed variation in feature density.

Provided herein are apparatuses and methods utilizing etch stop layers for high-quality templates and/or high-quality masks for fabricating patterned apparatuses such as patterned recording media, including BPM.

Figure 2A:
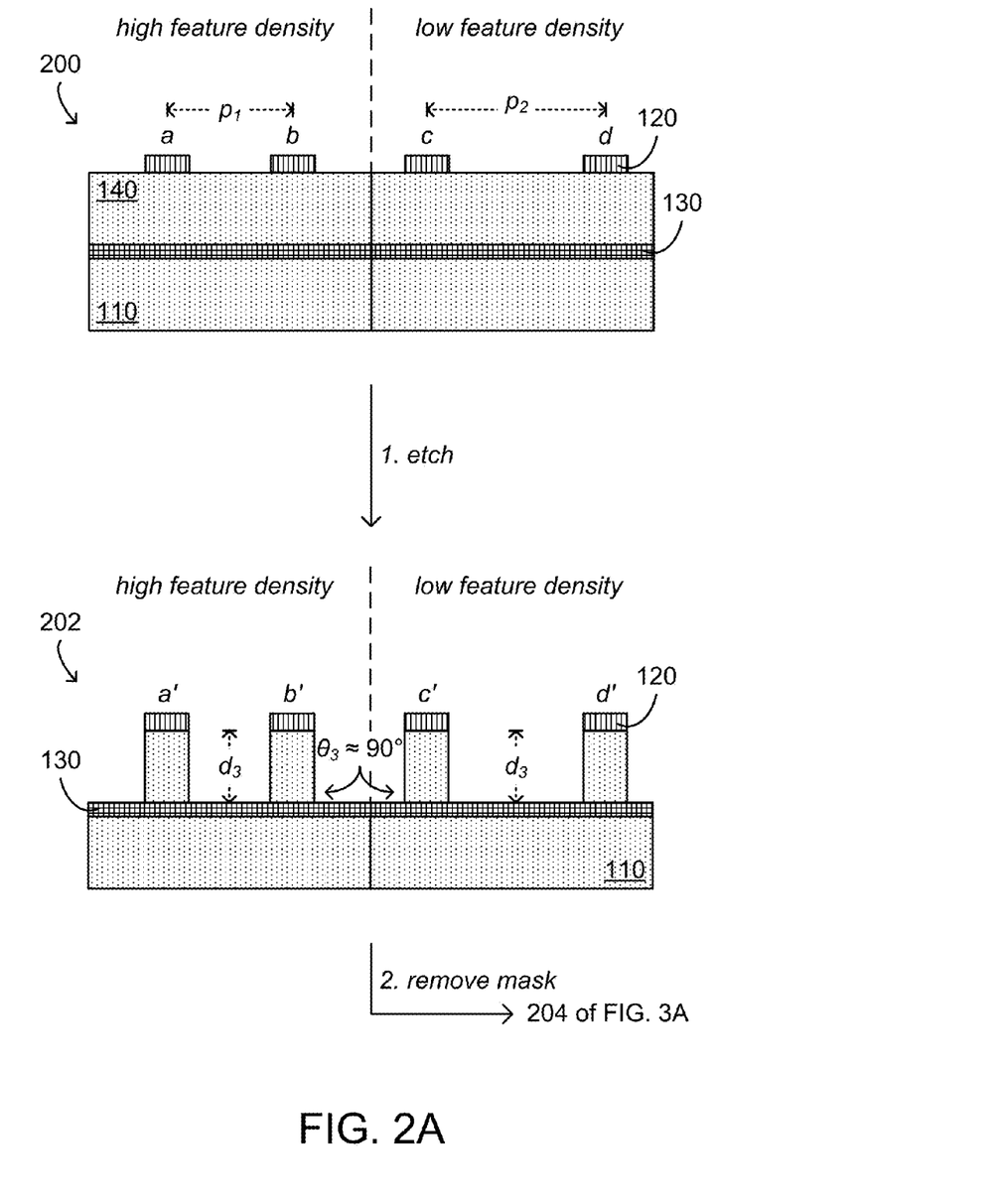
FIG. 2A provides a schematic illustrating an apparatus and method utilizing an etch stop layer according to one aspect.

FIG. 2A provides a schematic illustrating an apparatus and method utilizing an etch stop layer according to one aspect. It should be understood that the apparatus and method of FIG. 2A are not intended to limit the scope of the concepts provided herein.

As illustrated in FIG. 2A, a cross-section of such an apparatus 200 includes a region of relatively high feature density and a region of relatively low feature density as an example of the design-imposed variation in feature density. The apparatus 200 further includes a substrate 110, an etch stop layer 130 overlying the substrate 110, and a patterned layer, which, for the apparatus 200 of FIG. 2A, includes an etchable layer 140 overlying the etch stop layer 130, a patterned mask 120 overlying the etchable layer 140, which patterned layer includes features a and b in the region of high feature density and features c and d in the region of low feature density. The features a and b have a center-to-center pitch $p_1$ therebetween, and the features c and d have a center-to-center pitch $p_2$ therebetween, wherein $p_1 < p_2$ in accordance with the features a and b being in the region of high feature density and the features c and d being in the region of low feature density. In view of $p_1 < p_2$, the features a and b have a relatively high aspect ratio and the features c and d have a relatively low aspect ratio for features a-d of equal height.

As further illustrated in FIG. 2A, a cross-section of an apparatus 202 includes features a' and b' in the region of high feature density and features c' and d' in the region of low feature density subsequent to etching the etchable layer 140 of the apparatus 200. With respect to the feature profile element of feature depth, each of the features a'-d' has a consistent feature depth in accordance with the depth of the etch stop layer 130 despite the design-imposed variation in feature density. This is illustrated by the features a' and b' having a feature depth $d_3$, and the features c' and d' having the same feature depth $d_3$, despite the features a' and b' being in the region of high feature density and the features c' and d' being in the region of low feature density and/or despite the features a' and b' having a high aspect ratio and the features c' and d' having a low aspect ratio. With respect to the feature profile element of feature sidewall angle, each of the features a'-d' has a consistent feature sidewall angle on account of the etch stop layer 130 despite the design-imposed variation in feature density. This is illustrated by the features a' and b' having a feature sidewall angle $\theta_3$ (nominally 90°), and the features c' and d' having the same feature sidewall angle $\theta_3$, despite the features a' and b' being in the region of high feature density and the features c' and d' being in the region of low feature density and/or despite the features a' and b' having a high aspect ratio and the features c' and d' having a low aspect ratio. In addition to being consistent with respect to feature profile elements of feature depth and feature sidewall angle, each of the features a'-d' may further be consistent in feature position and other feature profile elements such as feature size despite the design-imposed variation in feature density.

Figure 3A:
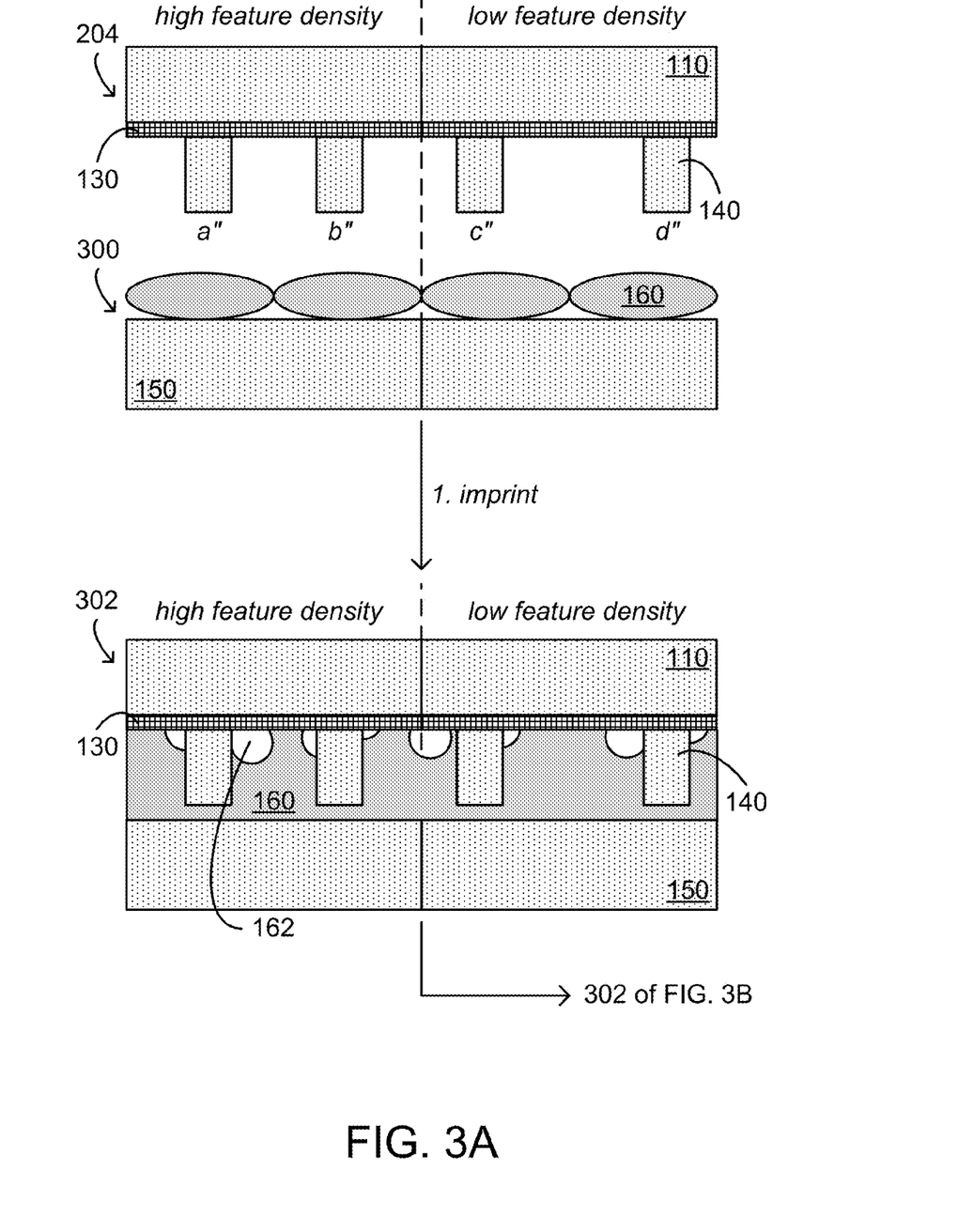
FIGS. 3A-3C provide schematics illustrating an apparatus and method utilizing a porous etch stop layer according to one aspect.

As further illustrated in FIG. 2A, the patterned mask 120 of apparatus 202 may be removed after etching to yield an apparatus or template 204 of FIG. 3A. Turning briefly to FIG. 3A, a cross-section of the template 204 includes features a" and b" in the region of high feature density and features c" and d" in the region of low feature density subsequent to removing the patterned mask 120 of the apparatus 202. The features a"-d" of the template 204 maintain the feature profiles of the features a'-d' of the apparatus 202 subsequent to removing the patterned mask 120 of the apparatus 202. Furthermore, in maintaining the feature profiles of the features a'-d', which are consistent in feature position and various feature profile elements, the template 204 may improve the planarity and/or features of an imprinted surface (e.g., imprinted resist) over other templates that are not as consistent in feature position and various feature profile elements.

Figure 2B:
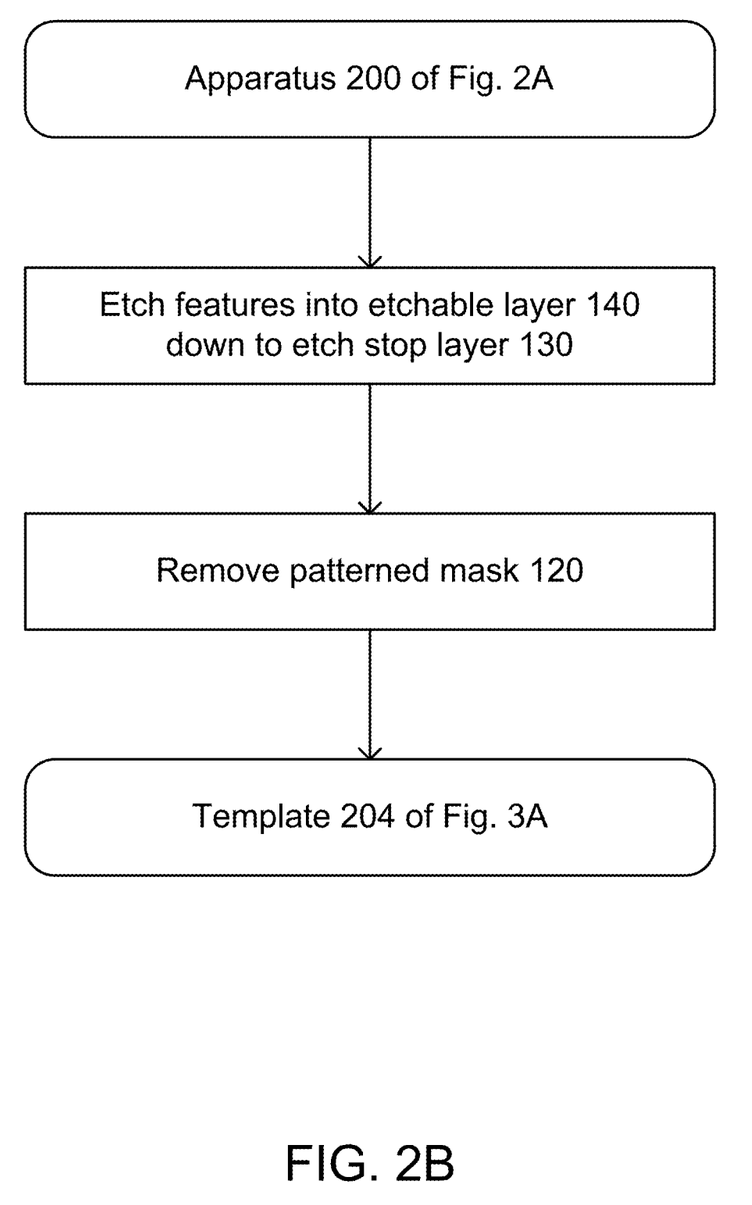
FIG. 2B provides a flow chart for a method utilizing an etch stop layer according to one aspect.

FIG. 2B provides a flow chart for a method utilizing an etch stop layer according to one aspect. It should be understood that the method of FIG. 2B is not intended to limit the scope of the concepts provided herein.

Turning back to FIG. 2A and elements related thereto, the apparatuses (e.g., the apparatuses 200 and 202 in FIG. 2A) may be workpieces leading to the apparatus or template (e.g., the template 204 in FIG. 3A) for fabricating patterned apparatuses, which template includes an imprint template (e.g., a microimprint template, a nanoimprint template, etc.) for a semiconductor device, a recording device, or workpieces thereof. A semiconductor devices includes, but is not limited to, a two-terminal device such as a light-emitting diode ("LED"), a photocell, or a solar cell, and a multi-terminal device such as an integrated circuit ("IC"), a charge-coupled device ("CCD"), a microprocessor, a random-access memory ("RAM"), or a read-only memory ("ROM"). A recording device includes, but is not limited to, any recording medium to which lithographic (e.g., microlithographic, nanolithographic, etc.) patterning may be applied or extended, including, but not limited to, longitudinal magnetic recording media ("LMR"), perpendicular magnetic recording media ("PMR"), heat-assisted magnetic recording media ("HAMR"), discrete track recording media ("DTR"), and BPM.

With respect to the substrate (e.g., the substrate 110 of the apparatus 200 in FIG. 2A), the substrate may include any substrate suitable for use in an imprint template (e.g., a microimprint template, a nanoimprint template, etc.) for a semiconductor device, a recording device, or a workpiece thereof. For applications in which the imprint template is used to imprint a photoresist, the substrate may be sufficiently transparent to radiation for curing the photoresist. For example, the substrate may be sufficiently transparent to ultraviolet ("UV") radiation for curing a UV-curable photoresist. In view of the foregoing, the substrate may include, but is not limited to, a silicon-based material selected from $SiO_2$, glass, and quartz. For applications in which the imprint template is used to imprint a thermal resist, the substrate may be sufficiently thermally conductive to radiation for curing the thermal resist. For example, the substrate may be sufficiently thermally conductive to thermal radiation for curing a heat-curable thermal resist.

With respect to the etch stop layer (e.g., the etch stop layer 130 of the apparatus 200 in FIG. 2A), the etch stop layer may include any etch stop layer substantially resistant to etching conditions for etching an overlying etchable layer (e.g., the etchable layer 140 of the apparatus 200 in FIG. 2A) in a fabricating environment. The etch stop layer being substantially resistant to the etching conditions includes the etch stop layer being chemically resistant to the etching conditions for at least the time required to effect etching of the overlying etchable layer to the desired specification in the fabricating environment. The etch stop layer being substantially resistant to the etching conditions further includes the etch stop layer being chemically resistant to the etching conditions for an indefinite amount of time. For example, the etch stop layer may be substantially resistant to fluorine-based etching conditions for etching the overlying etchable layer. In view of the foregoing, the etch stop layer may include, but is not limited to, a metal such as chromium.

Further with respect to the etch stop layer (e.g., the etch stop layer 130 of the apparatus 200 in FIG. 2A), as provided in more detail herein, the etch stop layer may be configured to be porous for a gas to pass therethrough for imprinting a resist and/or separating from an imprinted resist. In view of the foregoing, the etch stop layer may include, but is not limited to, silicon (e.g., microporous silicon), a carbide-derived carbon ("CDC") or tunable nanoporous carbon, a covalent organic framework ("COF"), a metal nano-foam, and other hydrophobic nanoporous materials.

Further with respect to the etch stop layer, for applications in which the imprint template is used to imprint a photoresist, the etch stop layer may be configured to be sufficiently transparent to radiation (e.g., UV radiation) for curing the photoresist (e.g., a UV-curable photoresist). In view of the foregoing, the etch stop layer may include, but is not limited to, a metal such as chromium. For applications in which the imprint template is used to imprint a thermal resist, the etch stop layer may be configured to be sufficiently thermally conductive to radiation (e.g., thermal radiation) for curing the thermal resist (e.g., heat-curable thermal resist).

Further with respect to the etch stop layer, the etch stop layer may be of a sufficient thickness to effect the desired chemical resistance, porosity, transparency, and/or thermal conductivity of the etch stop layer in accordance with that provided herein. In some non-limiting embodiments, for example, the etch stop layer may be at least 1 nm, 2 nm, 3 nm, 4 nm, 5 nm, 6 nm, 7 nm, 8 nm, 9 nm, 10 nm, 15 nm, or 20 nm thick. In some non-limiting embodiments, for example, the etch stop layer may be no more than 20 nm, 15 nm, 10 nm, 9 nm, 8 nm, 7 nm, 6 nm, 5 nm, 4 nm, 3 nm, 2 nm, or 1 nm thick. Combination of the foregoing may also be used to describe the thickness of the etch stop layer. In some embodiments, for example, the etch stop layer may be at least 1 nm thick and no more than 20 nm thick (e.g., 1-20 nm thick), including at least 1 nm thick and no more than 10 nm thick (e.g., 1-10 nm thick), such as at least 1 nm thick and no more than 5 nm thick (e.g., 1-5 nm thick), for example, at least 3 nm thick and no more than 5 nm thick (e.g., 3-5 nm thick).

With respect to the etchable layer (e.g., the etchable layer 140 of the apparatus 200 in FIG. 2A) or an etched layer thereof, the etchable layer may include any etchable layer substantially labile to etching conditions in a fabricating environment. The etchable layer being substantially labile to the etching conditions includes the etchable layer being chemically labile to the etching conditions equal to or under a reasonable amount of time for etching the etchable layer to the desired specification in the fabricating environment. For example, the etchable layer may be substantially labile to fluorine-based etching conditions for etching the etchable layer. In view of the foregoing, the etchable layer may include, but is not limited to, a silicon-based material selected from $SiO_2$, glass, and quartz.

With respect to the patterned mask (e.g., the patterned mask 120 of the apparatus 200 in FIG. 2A), the patterned mask may include any mask patterned in accordance with current or future lithographic (e.g., microlithographic, nanolithographic, etc.) techniques. For example, the patterned mask may include a hard mask patterned in accordance with a lithographic technique such as electron-beam writing ("EBW") or directed self-assembly ("DSA"). The patterned mask may further include any patterned mask that may be removed from the underlying etchable or etched layer in accordance with current or future lithographic (e.g., microlithographic, nanolithographic, etc.) techniques. For example, the patterned mask may include a patterned hard mask that may be removed from the underlying etchable or etched layer by wet stripping. In view of the foregoing, the patterned mask may include, but is not limited to, a metal such as chromium.

With respect to the patterned layer, the patterned layer may include the patterned mask, the etched or etchable layer, or a combination of the patterned mask and the etched or etchable layer. In a first example, the patterned layer may include the patterned mask 120 of the apparatus 200 of FIG. 2A, which patterned layer includes features a and b of the patterned mask. In a second example, the patterned layer may include the etched layer 140 of the apparatus 204 of FIG. 3A, which patterned layer includes features a" and b" of the etched layer. In a third example, the patterned layer may include the combination of the patterned mask 120 and the etchable layer 140 of the apparatus 200 of FIG. 2A, which patterned layer includes features a and b of the patterned mask. In a fourth example, the patterned layer may include the combination of the patterned mask 120 and the etched layer 140 of the apparatus 202 of FIG. 2A, which patterned layer includes features a' and b' of the patterned mask and the etched layer.

With respect to the features (e.g., the features a and b of apparatus 200 of FIG. 2A; the features a' and b' of apparatus 202 of FIG. 2A; and the features a" and b" of apparatus 204 of FIG. 3A), the features may include, but are not limited to, features individually or collectively having shapes selected from polyhedrons, such as prisms, including right prisms, parallelepipeds, and cubes; pillars or cylinders, such as right cylinders; spheres; and combinations thereof, such as sphere-and-pillar-type features. The foregoing is not intended to be limiting as the features may include features individually or collectively having, for example, elongated forms of the foregoing shapes (e.g., elongated parallelepipeds forming lines or a line-type features, for example, lamellae).

Further with respect to the features, the features may include, but are not limited to, features individually or collectively selected from micrometer-sized features and nanometer-sized features, wherein micrometer-sized features admit of μm units as measured, and wherein nanometer-sized features admit of nm units as measured. With respect to nanometer-sized features, for example, the nanometer-sized features may individually or collectively be tens of nanometers or less in at least a minor dimension, wherein tens of nanometers or less includes multiples of ten nanometers or less. In some non-limiting embodiments, with respect to nanometer-sized features, for example, the features may individually or collectively be at least 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, or 20 nm in a minor dimension. In some non-limiting embodiments, with respect to nanometer-sized features, for example, the features may individually or collectively be no more 20 nm, 19 nm, 18 nm, 17 nm, 16 nm, 15 nm, 14 nm, 13 nm, 12 nm, 11 nm, 10 nm, 9 nm, 8 nm, 7 nm, 6 nm, 5 nm, 4 nm, 3 nm, 2 nm, or 1 nm in a minor dimension. Combinations of the foregoing may also be used to describe nanometer-sized features. In some non-limiting embodiments, with respect to nanometer-sized features, for example, the features may individually or collectively be at least 1 nm and no more than 20 nm (e.g., 1-20 nm) in a minor dimension, such as at least 5 nm and no more than 15 nm (e.g., 5-15 nm) in a minor dimension, including at least 8 nm and no more than 12 nm (e.g., 8-12 nm) in a minor dimension, for example, at least 9 nm and no more than 10 nm (e.g., 9-10 nm) in a minor dimension. The foregoing is not intended to be limiting as the features may individually or collectively be sized as appropriate per apparatus (e.g., workpiece leading to the apparatus or template for fabricating patterned apparatuses).

Further with respect to the features, the features may include a pitch between the features such as a center-to-center pitch between the features (e.g., $p_1$ between features a and b of FIG. 2a; $p_2$ between features c and d of FIG. 2a). The pitch may be selected from a micrometer-sized pitch and a nanometer-sized pitch, wherein a micrometer-sized pitch admits of μm units as measured, and wherein a nanometer-sized pitch admits of nm units as measured. In some non-limiting embodiments, with respect to a nanometer-sized pitch between the features, for example, the pitch may be at least 1 nm, 5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, or 30 nm between the features. In some non-limiting embodiments, with respect to a nanometer-sized pitch between the features, for example, the pitch may be no more than 30 nm, 25 nm, 24 nm, 23 nm, 22 nm, 21 nm, 20 nm, 19 nm, 18 nm, 17 nm, 16 nm, 15 nm, 14 nm, 13 nm, 12 nm, 11 nm, 10 nm, 5 nm, or 1 nm between the features. Combinations of the foregoing may also be used to describe a nanometer-sized pitch between the features. In some embodiments, with respect to a nanometer-sized pitch between the features, for example, the pitch may be at least 1 nm and no more than 30 nm (e.g., 1-30 nm) between the features, such as at least 5 nm and no more than 25 nm (e.g., 5-25 nm) between the features, including at least 10 nm and no more than 25 nm (e.g., 10-25 nm) between the features, for example, at least 15 nm and no more than 20 nm (e.g., 15-20 nm) between the features. The foregoing is not intended to be limiting as the pitch between the features may be sized as appropriate per apparatus (e.g., workpiece leading to the apparatus or template for fabricating patterned apparatuses).

Further with respect to the features, the features may include a distance between the features such as a sidewall-to-sidewall distance between the features, which sidewall-to-sidewall distance between the features may be less than the center-to-center pitch between the features. The sidewall-to-sidewall distance between the features may be selected from a micrometer-sized sidewall-to-sidewall distance and a nanometer-sized sidewall-to-sidewall distance, wherein a micrometer-sized sidewall-to-sidewall distance admits of μm units as measured, and wherein a nanometer-sized sidewall-to-sidewall distance admits of nm units as measured. In some non-limiting embodiments, with respect to a nanometer-sized sidewall-to-sidewall distance between the features, for example, the sidewall-to-sidewall distance may be at least 1 nm, 2 nm, 3 nm, 4 nm, 5 nm, 6 nm, 7 nm, 8 nm, 9 nm, 10 nm, 11 nm, 12 nm, 13 nm, 14 nm, or 15 nm between the features. In some non-limiting embodiments, with respect to a nanometer-sized sidewall-to-sidewall distance between the features, for example, the sidewall-to-sidewall distance may be no more than 15 nm, 14 nm, 13 nm, 12 nm, 11 nm, 10 nm, 9 nm, 8 nm, 7 nm, 6 nm, 5 nm, 4 nm, 3 nm, 2 nm, or 1 nm between the features. Combinations of the foregoing may also be used to describe a nanometer-sized sidewall-to-sidewall distance between the features. In some embodiments, with respect to a nanometer-sized sidewall-to-sidewall distance between the features, for example, the sidewall-to-sidewall distance may be at least 1 nm and no more than 15 nm (e.g., 1-15 nm) between the features, such as at least 1 nm and no more than 10 nm (e.g., 1-10 nm) between features, including at least 1 nm and no more than 5 nm (e.g., 1-5 nm) between features, for example, at least 4 nm and no more than 5 nm (e.g., 4-5 nm) between features. The foregoing is not intended to be limiting as the sidewall-to-sidewall between the features may be sized as appropriate per apparatus (e.g., workpiece leading to the apparatus or template for fabricating patterned apparatuses).

Further with respect to the features, and further with respect to the pitch between the features and/or the sidewall-to-sidewall distance between the features, the pitch between the features and/or the sidewall-to-sidewall distance between the features may be different in different regions of the apparatus (e.g., workpiece leading to the apparatus or template for fabricating patterned apparatuses). Such a difference between the pitch between the features and/or the sidewall-to-sidewall distance between the features may include, for example, a region of relatively high feature density and a region of relatively low feature density as illustrated in FIGS. 2A and 3A-3C. For features of equal height, the features in the region of relatively high feature density and the features in the region of relatively low feature density may be described as respectively having a relatively high aspect ratio and a relatively low aspect ratio. The features in regions of high feature density may include, but are not limited to, features tens of units (e.g., micrometers, nanometers, etc.) or less in the pitch between the features and/or the sidewall-to-sidewall distance between the features, wherein tens of units (e.g., micrometers, nanometers, etc.) or less includes multiples of ten units (e.g., micrometers, nanometers, etc.) or less. The features in regions of low feature density may include, but are not limited to, features hundreds of units (e.g., micrometers, nanometers, etc.) or less in the pitch between the features and/or the sidewall-to-sidewall distance between the features, wherein hundreds of units (e.g., micrometers, nanometers, etc.) or less includes multiples of a hundred units (e.g., micrometers, nanometers, etc.) or less. In view of the foregoing, the features in regions of low feature density may be at least 10 times farther apart than the features in regions of high feature density; however, it should be understood that the features in regions of low feature density may be less than 10 times farther apart than the features in regions of high feature density and still have a relatively low feature density when compared to regions of relatively high feature density.

Further with respect to the features, subsequent to etching the etchable layer 140 in accordance with apparatuses and methods provided herein, the features may exhibit substantially consistent feature positions and/or substantially consistent feature profiles, including but not limited to, one or more feature profile elements selected from feature depth, feature sidewall angle, and features size, between similar features or portions thereof despite any design-imposed variation in feature density such as regions of high feature density and regions of low feature density. With respect to the feature profile element of feature depth, for example, the features (e.g., the features a' and b' of apparatus 202 of FIG. 2A and the features a" and b" of apparatus 204 of FIG. 3A) may exhibit a substantially consistent feature depth (e.g., $d_3$ of FIG. 2A) in accordance with the depth of the etch stop layer. In some non-limiting embodiments, for example, the features may exhibit an average feature depth in accordance with the depth of the etch stop layer with a standard deviation in the average feature depth of no more than 10 Å, 9 Å, 8 Å, 7 Å, 6 Å, 5 Å, 4 Å, 3 Å, 2 Å, or 1 Å. With respect to the feature profile element of feature sidewall angle, for example, the features (e.g., the features a' and b' of apparatus 202 of FIG. 2A and the features a" and b" of apparatus 204 of FIG. 3A) may exhibit a substantially consistent feature sidewall angle (e.g., $\theta_3$ of FIG. 2A). In some non-limiting embodiments, for example, the features may exhibit an average feature sidewall angle at least 70°, 75°, 80°, 81°, 82°, 83°, 84°, 85°, 86°, 87°, 88°, 89°, or 90°, optionally with a standard deviation in the average sidewall angle of no more than 5°, 4°, 3°, 2°, 1°, 0.5°, 0.4°, 0.3°, 0.2°, or 0.1°.

Turning to FIGS. 3A-3D, the etch stop layer may be configured to be porous as provided herein for a gas to pass therethrough for imprinting a resist and/or separating from an imprinted resist. Configuring the etch stop layer to be porous for a gas to pass therethrough allows the resist to completely fill each and every space between the features of a template including the porous etch stop layer, thereby reducing or eliminating topographical imperfections in the resulting imprinted resist. In addition, separation of a template including the porous etch stop layer from the imprinted resist after imprinting reduces an otherwise excessive separation force to overcome a partial vacuum created between the template and the imprinted resist during the separation. Reducing the otherwise excessive separation force minimizes or eliminates dislocation, collapse, and/or other damage to the features of the imprinted resist.

Figure 3B:
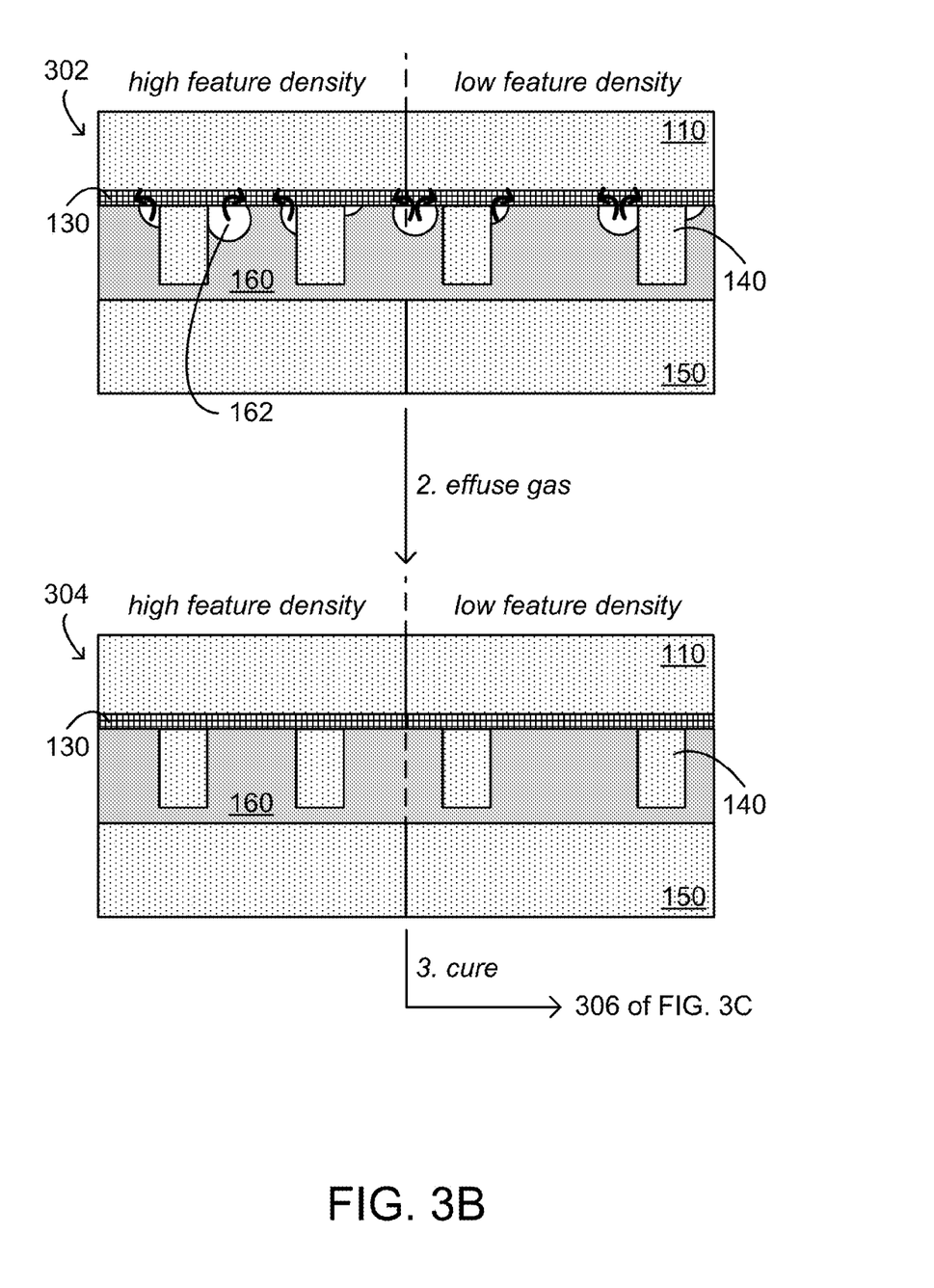
Figure 3C:
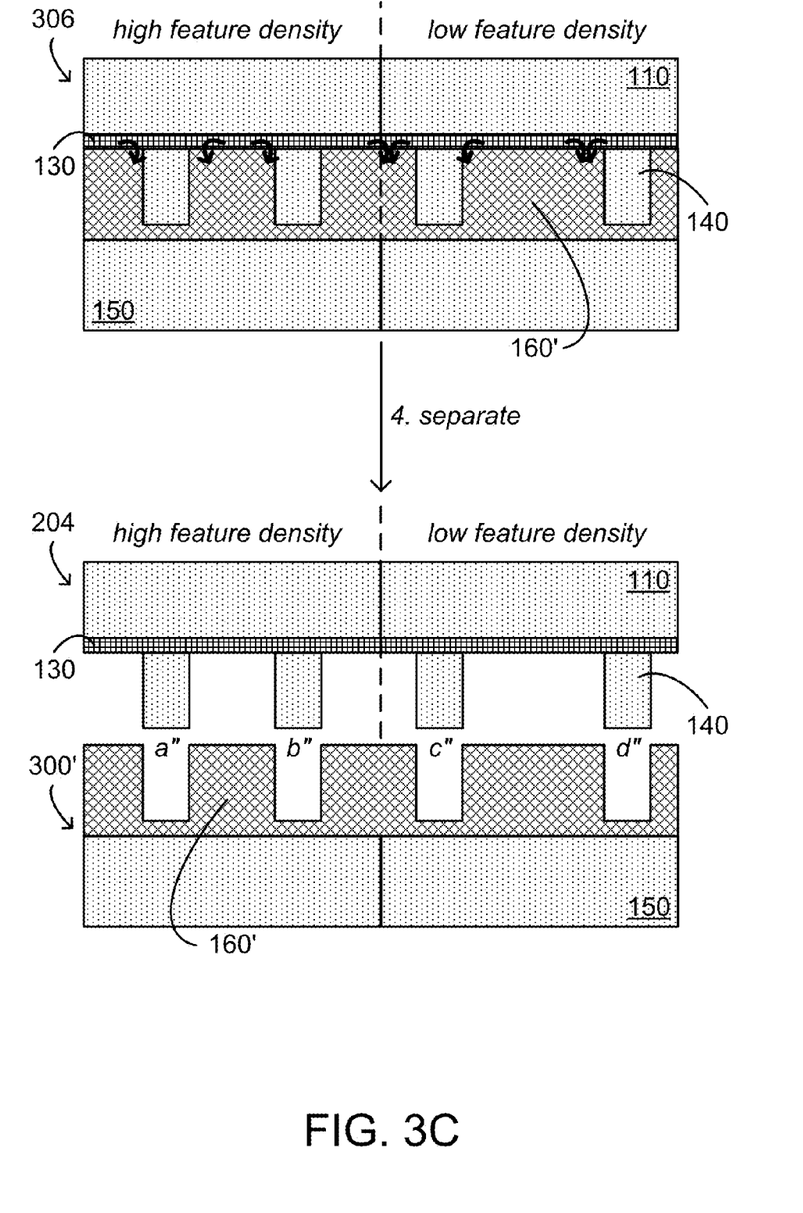

FIGS. 3A-3C provide schematics illustrating an apparatus and method utilizing a porous etch stop layer according to one aspect. It should be understood that the apparatus and method of FIGS. 3A-3C are not intended to limit the scope of the concepts provided herein.

As illustrated in FIG. 3A, a cross-section of an apparatus or template 204 includes a region of relatively high feature density and a region of relatively low feature density as an example of the design-imposed variation in feature density. The template 204 further includes a substrate 110, a porous etch stop layer 130 overlying the substrate 110, and a patterned layer, which, for the template 204 of FIG. 3A, includes an etched layer 140 overlying the porous etch stop layer 130, which patterned layer includes features a" and b" in the region of high feature density and features c" and d" in the region of low feature density. With respect to features of the template 204, including, but not limited to, the substrate 110, the etch stop layer 130, and the features a" and b", description of the features includes that provided herein.

As further illustrated in FIG. 3A, the template 204 is in a pre-imprint position with respect to an apparatus 300, which apparatus 300 includes a substrate 150 and a resist 160 for imprinting. With respect to the substrate (e.g., the substrate 150 of the apparatus 300 in FIG. 3A), the substrate may include any substrate suitable for use in a patterned apparatus, which patterned apparatus includes a semiconductor device, a recording device, or a workpiece thereof. A semiconductor device includes, but is not limited to, a two-terminal device such as an LED, a photocell, or a solar cell, and a multi-terminal device such as an IC, a CCD, a microprocessor, a RAM, or a ROM. A recording device includes, but is not limited to, any recording medium to which lithographic (e.g., microlithographic, nanolithographic, etc.) patterning may be applied or extended, including, but not limited to, LMR, PMR, HAMR, DTR, and BPM. With respect to the resist (e.g., the resist 160 of apparatus 300 in FIG. 3A), the resist may include, but is not limited to, a resist selected from a resist for lithography (e.g., microlithography, nanolithography, etc.), a resist for semiconductor device processing, a resist for recording device processing, and the like, which resist may include a heat-curable thermal resist or a UV-curable resist. The resist may include, but is not limited to, a polymer selected from an organic polymer and a mixed inorganic-organic polymer (e.g., polysiloxanes), which polymer may have any of variously available microstructures, architectures (e.g., copolymers, including block copolymers), cross-linkages, and the like.

As further illustrated in FIG. 3A, a cross-section of an apparatus 302 includes the template 204 and the apparatus 300 with a resist 160 subsequent to initially imprinting the resist 160 of the apparatus 300. Apparatus 302 further includes gas in gas bubbles 162 of the resist 160, which gas bubbles 162, in the absence of the porous etch stop layer 130, would prevent the resist 160 from completely filling each and every space between the features a"-d" of the template 204 and lead to topographical imperfections in the resulting imprinted resist.

As illustrated in FIG. 3B, however, in the presence of the porous etch stop layer 130, the gas in the gas bubbles 162 of the resist 160 is allowed to effuse through the porous etch stop layer 130 as indicated by the arrows leading away from the gas bubbles 162. As further illustrated in FIG. 3B, the resist 160 may subsequently conformally fill or completely fill each and every space between the features a"-d" of the template 204, thereby reducing or eliminating topographical imperfections in the resulting imprinted resist, as illustrated by a cross-section of an apparatus 304 in which the gas bubbles 162 are absent from the resist 160. As further illustrated in FIG. 3B, the resist 160 of the apparatus 304 may subsequently be cured.

As illustrated in FIG. 3C, a cross-section of an apparatus 306 includes the template 204 and a cured resist 160' thereabout subsequent to curing the resist 160 of the apparatus 304. In the absence of the porous etch stop layer 130, separation of the template 204 from the cured resist 160' would require an excessive separation force to overcome a partial vacuum created between the template 204 and the cured resist 160' during the separation. However, in the presence of the porous etch stop layer 130, gas is allowed to effuse through the porous etch stop layer 130 into the partial vacuum created between the template 204 and the cured resist 160' as indicated by the arrows leading away from the etch stop layer 130. As further illustrated in FIG. 3C, the separation of the template 204 from the cured resist 160' provides an apparatus 300' including the cured resist 160' with features a"-d" imprinted therein, wherein dislocation, collapse, and/or other damage to the features of the imprinted resist is reduced or eliminated.

Figure 3D:
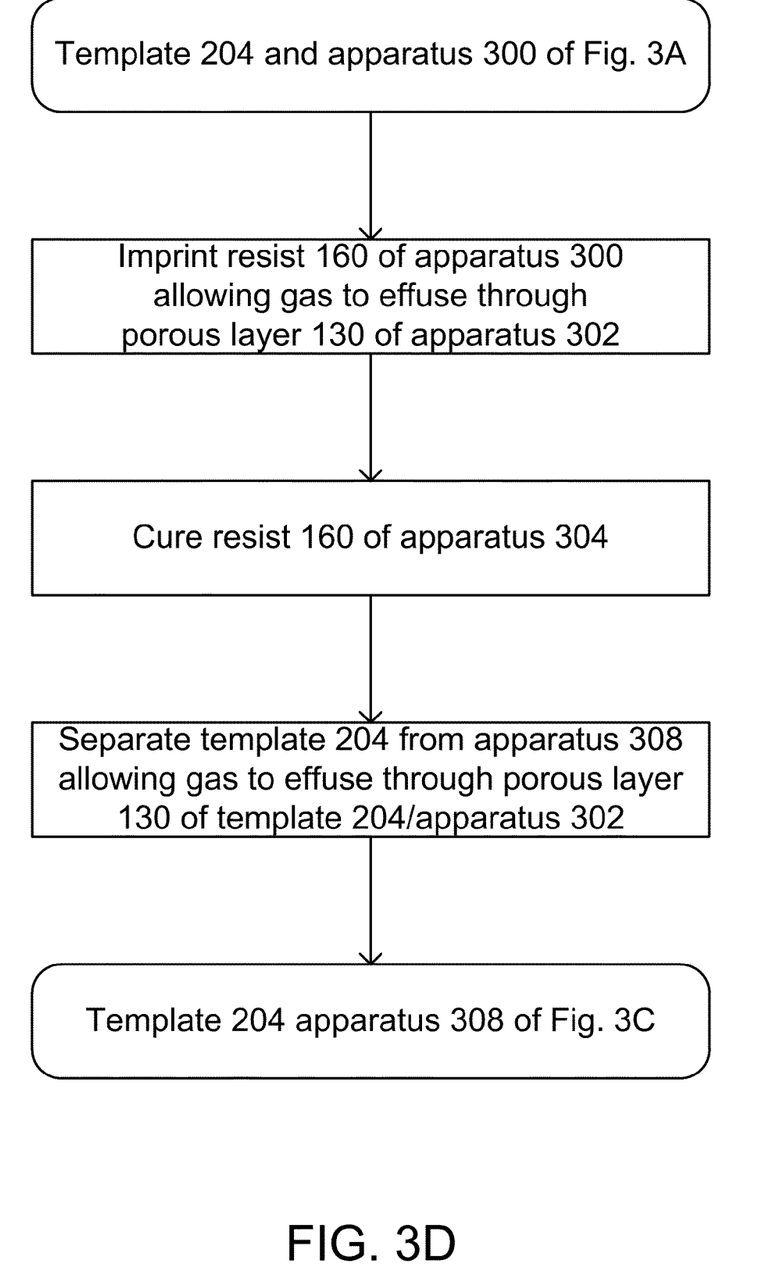
FIG. 3D provides a flow chart for a method utilizing a porous etch stop layer according to one aspect.

FIG. 3D provides a flow chart for a method utilizing a porous etch stop layer according to one aspect. It should be understood that the method of FIG. 3D is not intended to limit the scope of the concepts provided herein.

As such, provided herein is an apparatus, comprising a substrate; an etch stop layer overlying the substrate; and a patterned layer overlying the etch stop layer, wherein the etch stop layer is substantially resistant to etching conditions and the patterned layer is substantially labile to the etching conditions, and wherein the patterned layer comprises a plurality of nanometer-sized features comprising substantially consistent feature profiles among regions of high feature density and regions of low feature density. In some embodiments, each feature of the plurality of nanometer-sized features is tens of nanometers or less in at least a minor dimension of the feature. In some embodiments, the substantially consistent feature profiles are substantially consistent with respect to depths and sidewall angles. In some embodiments, features in the regions of low feature density are spaced at least 10 times farther apart than features in the regions of high feature density. In some embodiments, features in the regions of low feature density are hundreds of nanometers or less in center-to-center pitch, and features in the regions of high feature density are tens of nanometers or less in center-to-center pitch. In some embodiments, the etching conditions are fluorine-based etching conditions. In some embodiments, the etch stop layer is configured to be transparent to UV radiation for curing a UV-curable photoresist. In some embodiments, the etch stop layer comprises chromium. In some embodiments, the etch stop layer is configured to be porous for a gas to pass therethrough for imprinting a resist or separating from an imprinted resist. In some embodiments, the etch stop layer comprises silicon, a carbide-derived carbon, a covalent organic framework, or a metal nano-foam. In some embodiments, the apparatus further comprises a patterned mask overlying the patterned layer, wherein the patterned mask comprises a plurality of nanometer-sized features corresponding to the plurality of nanometer-sized features of the patterned layer.

Also provided herein is a method, comprising creating a mask comprising a pattern for etching a plurality of nanometer-sized features into an underlying layer; etching the plurality of nanometer-sized features into the underlying layer down to an underlying stop layer; and removing the mask, wherein the plurality of nanometer-sized features comprise substantially consistent feature depths among regions of high feature density and regions of low feature density. In some embodiments, an average depth of the feature depths between the regions of high feature density and the regions of low feature density has a standard deviation no more than 5 Å. In some embodiments, the underlying layer is substantially labile to fluorine-based etching conditions, and the underlying stop layer is substantially resistant to fluorine-based etching conditions. In some embodiments, the underlying stop layer is less than or equal to 10 nm thick and comprises chromium.

Also provided herein is a method, comprising creating a mask comprising a pattern for etching a plurality of nanometer-sized features into an underlying layer; etching the plurality of nanometer-sized features into the underlying layer down to an underlying stop layer; and removing the mask, wherein the plurality of nanometer-sized features comprise substantially consistent feature sidewall angles among regions of high feature density and regions of low feature density. In some embodiments, an average sidewall angle of the feature sidewalls angles between the regions of high feature density and the regions of low feature density has a standard deviation no more than 0.5°. In some embodiments, the underlying stop layer is substantially porous for gas to pass therethrough for imprinting a resist or separating an imprinted resist. In some embodiments, the underlying etch stop layer comprises silicon, a carbide-derived carbon, a covalent organic framework, or a metal nano-foam.

While some particular embodiments have been illustrated and/or described herein, and while the particular embodiments have been illustrated and/or described in some detail, it is not the intention of the applicant(s) for the particular embodiments to limit the scope of the concepts presented herein. Additional adaptations and/or modifications may readily appear to persons having ordinary skill in the art, and, in broader aspects, these adaptations and/or modifications may be encompassed as well. Accordingly, departures may be made from the particular embodiments illustrated and/or described herein without departing from the scope of the concepts provided herein. The implementations provided herein and other implementations are within the scope of the following claims.

What is claimed is:

1. A template comprising:
a substrate;
an etch stop layer directly overlying the substrate; and
a patterned layer overlying the etch stop layer,
wherein the etch stop layer is substantially resistant to etching conditions and the patterned layer is substantially labile to the etching conditions, and wherein the etch stop layer is porous and passes gas trapped between the template and a device with a resist deposited thereto when the template becomes in contact with the device.

2. The template of claim 1, wherein the patterned layer comprises an etchable layer.

3. The template of claim 2, wherein the patterned layer further comprises a mask overlying the etchable layer.

4. The template of claim 2, wherein the patterned layer is substantially labile to fluorine-based etching, and wherein the etching conditions are fluorine-based etching conditions.

5. The template of claim 2, wherein the etchable layer is selected from a group consisting of $SiO_2$, glass, chromium, and quartz.

6. The template of claim 1, wherein the etch stop layer is selected from a group consisting of silicon, carbide-derived carbon, tunable nanoporous carbon, a covalent organic framework, and a metal nano-foam.

7. The template of claim 1, wherein the etch stop layer is selected from a group consisting of transparent material to radiation and a thermally conductive material to radiation.

8. The template of claim 1, wherein the substrate is selected from a group consisting of transparent material to radiation and thermally conductive material to radiation.

9. A template comprising:
an etch stop layer; and a patterned layer overlying the etch stop layer, wherein the etch stop layer is substantially resistant to etching conditions and the patterned layer is substantially labile to the etching conditions, and wherein the etch stop layer is porous and passes gas trapped between the template and a device with a resist deposited thereto when the template becomes in contact with the device.

10. The template of claim 9, wherein the patterned layer comprises an etchable layer.

11. The template of claim 10, wherein the patterned layer further comprises a mask overlying the etchable layer.

12. The template of claim 10, wherein the patterned layer is substantially labile to fluorine-based etching, and wherein the etching conditions are fluorine-based etching conditions.

13. The template of claim 10, wherein the etchable layer is selected from a group consisting of $SiO_2$, glass, chromium, and quartz.

14. The template of claim 9, wherein the etch stop layer is selected from a group consisting of silicon, carbide-derived carbon, tunable nanoporous carbon, a covalent organic framework, and a metal nano-foam.

15. The template of claim 9, wherein the etch stop layer is selected from a group of transparent material to radiation and thermally conductive material to radiation.

16. A template comprising:
a substrate;
an etch stop layer directly overlying the substrate, wherein the etch stop layer reduces a separation force between the template and a resist when the template becomes in contact with the resist by overcoming a partial vacuum created between the template and the resist; and
a patterned layer overlying the etch stop layer.

17. The template of claim 16, wherein the patterned layer comprises an etchable layer.

18. The template of claim 17, wherein the patterned layer further comprises a mask overlying the etchable layer.

19. The template of claim 17, wherein the patterned layer is substantially labile to fluorine-based etching, and wherein the etching conditions are fluorine-based etching conditions.

20. The template of claim 17, wherein the etchable layer is selected from a group consisting of $SiO_2$, glass, chromium, and quartz.

21. The template of claim 16, wherein the etch stop layer is selected from a group consisting of silicon, carbide-derived carbon, tunable nanoporous carbon, a covalent organic framework, and a metal nano-foam.

22. The template of claim 16, wherein the etch stop layer is selected from a group of transparent material to radiation and thermally conductive material to radiation.

23. The template of claim 16, wherein the substrate is selected from a group of transparent material to radiation and thermally conductive material to radiation.

* * * * *